… … … … US005554224A

United States Patent [19]
Foltyn

[11] Patent Number: 5,554,224
[45] Date of Patent: Sep. 10, 1996

[54] SUBSTRATE HEATER FOR THIN FILM DEPOSITION

[76] Inventor: Steve R. Foltyn, 111 Beryl St., Los Alamos, N.M. 87544

[21] Appl. No.: 222,195

[22] Filed: Mar. 31, 1994

[51] Int. Cl.⁶ .................................................. C23C 16/00
[52] U.S. Cl. ..................... 118/725; 118/730; 204/298.09
[58] Field of Search ........................ 156/345; 118/719, 118/724, 725, 730; 204/298.09

[56] References Cited

U.S. PATENT DOCUMENTS

| | | | |
|---|---|---|---|
| 5,280,156 | 1/1994 | Niori | 219/385 |
| 5,288,326 | 2/1994 | Maeda | 118/719 |
| 5,290,381 | 3/1994 | Nozawa | 156/345 |
| 5,294,778 | 3/1994 | Carman | 219/385 |
| 5,343,012 | 8/1994 | Hardy | 219/443 |

OTHER PUBLICATIONS

S. R. Foltyn et al. "Large–area, Two–sided Superconducting $YBa_2Cu_3O_{7-x}$ Films Deposited by Pulsed Laser Deposition", Appl. Phys. Lett. 59 (11), 9 Sep. 1991.
N. Newman et al., "Double Gun Off–Axis Sputtering of Large Area $YBa_2Cu_3O_{7-\delta}$Superconducting Films for Microwave Applications," Sep. 24, 1990.
J. Talvacchio et al., "Large–Area YBCO Films for Microwave Applications," Prac. ASC'90, IEEE Trans. Magn. vol. 27, No. 2 (1991).
James A. Greer et al., "Pulsed Laser Deposition of Oxides Over Large Areas," SPIE Proceedings, vol. 1377–79, Nov. 1990.

R. C. Estler et al., "A Versatile Substrate Heater for Use in Highly Oxidizing Atmospheres," Rev. Sci. Instrum. 62(2), Feb. 1991.
B. Holzapfel et al., "Off–axis Laser Deposition of $YBa_2Cu_3O_{7-\delta}$Thin Films," Appl. Phys. Lett. 61(26), 28 Dec. 1992.
M. F. Davis et al., "Deposition of High Quality $YBa_2Cu_3O_{7-\delta}$Thin Films Over large Areas by Pulsed Laser Ablation with Substrate Scanning," J. Appl. Phys. 69(10), 15 May 1991.

*Primary Examiner*—R. Bruce Breneman
*Assistant Examiner*—Joni Y. Chang

[57] ABSTRACT

A substrate heater for thin film deposition of metallic oxides upon a target substrate configured as a disk including means for supporting in a predetermined location a target substrate configured as a disk, means for rotating the target substrate within the support means, means for heating the target substrate within the support means, the heating means about the support means and including a pair of heating elements with one heater element situated on each side of the predetermined location for the target substrate, with one heater element defining an opening through which desired coating material can enter for thin film deposition and with the heating means including an opening slot through which the target substrate can be entered into the support means, and, optionally a means for thermal shielding of the heating means from surrounding environment is disclosed.

7 Claims, 1 Drawing Sheet

SUBSTRATE HEATER FOR THIN FILM DEPOSITION

FIELD OF THE INVENTION

The present invention relates to substrate heater for deposition of thin films, and more particularly a substrate heater for deposition of thin films of metal oxide films, e.g., thin films of superconducting metal oxides, at high temperatures. This invention is the result of a contract with the Department of Energy (Contract No. W-7405-ENG-36).

BACKGROUND OF THE INVENTION

One of the more promising near-term applications for superconducting thin films is in the area of passive microwave devices such as delay lines, resonators, antennas, and filters. Unlike applications involving junctions or weak links which involve relatively small coated areas, microwave devices require coating sizes of at least a few square centimeters with more complex designs requiring coated areas of ten square centimeters or more. Additionally, two-sided coatings are often desired for some applications.

Numerous techniques have been used to deposit superconducting thin films, but the highest quality films have been produced by in situ processes employing sputtering or pulsed laser deposition. Optimum superconducting performance by the superconducting films is obtained when such films are highly crystalline. This requires uniform and accurate heating of the substrate, e.g., heating in the vicinity of 800° C. for YBCO films.

The previously known substrate heaters have suffered from several deficiencies including, e.g., formation of tooling marks upon the deposited films from the support of the substrate during the deposition, temperature gradients across the substrate from the use of multiple lamp type heating elements, evaporation and subsequent contamination of the substrate from the sides of the substrate holder, and difficulties in loading a substrate into the heater. Additionally, in order to obtain two sided coatings, it is not possible to attach the substrate to a substrate holder, e.g., by use of silver paint, without degrading the quality of the film composition and the surface of one side.

It is an object of the present invention to provide a substrate heater having uniform heating of the substrate during a deposition of a thin film at high temperatures.

It is a further object of the invention to provide a substrate heater which leaves no tooling marks from the mounting fixture in the finished thin film coating.

It is a still further object of this invention to provide a substrate heater for coating both sides of a disk that eliminates the usage of any paint or paste for attachment to a substrate block or platform.

It is a still further object of the invention to provide a substrate heater with reduced contamination of the finished thin film coating from evaporation of the sides of the substrate heater.

SUMMARY OF THE INVENTION

To achieve the foregoing and other objects, and in accordance with the purposes of the present invention, as embodied and broadly described herein, the present invention provides a substrate heater for thin film deposition of metallic oxides upon a target substrate configured as a disk including means for supporting in a predetermined location a target substrate configured as a disk, means for rotating the target substrate upon the support means, and means for heating the target substrate, the heating means including a pair of heating elements defining a heating cavity around the support means and with one heater element situated on each side of the predetermined location for the target substrate, one heater element defining an opening through which a desired coating material can enter for thin film deposition and the heating means including an opening slot through which the target substrate can be entered into the heating cavity onto the support means. In another embodiment, the substrate heater further includes means for thermal shielding of the heating means from surrounding environment.

DETAILED DESCRIPTION

The present invention is concerned with a substrate heater for thin film deposition at high temperatures upon, e.g., both sides of, a disk shaped substrate. The substrate heater can facilitate, e.g., the pulsed laser deposition of thin films of a superconducting material such as $YBa_2Cu_3O_{7-x}$ (yttrium-barium-copper oxide) on both sides of a disk shaped substrate.

The substrate heater of the present invention uses a cavity-type heater arrangement so that the heater surrounds the substrate. The interior walls of the cavity-type heater can be maintained at a temperature only slightly higher than the required deposition temperature for the particular coating. This arrangement allows for the deposition of coating at higher temperatures than can be achieved with conventional radiative heating.

The substrate heater of this invention may be useful in many types of thin film deposition and processing. For example, the present substrate heater may be useful in certain configurations of rf sputtering, electron beam evaporation and chemical vapor deposition. The design of the present substrate heater is not limited to superconductive coatings or to coatings requiring high temperatures and may be useful, e.g, for a lower temperature process involving semiconducting materials, where temperature control over large wafer or disk areas are required.

Figure 1:
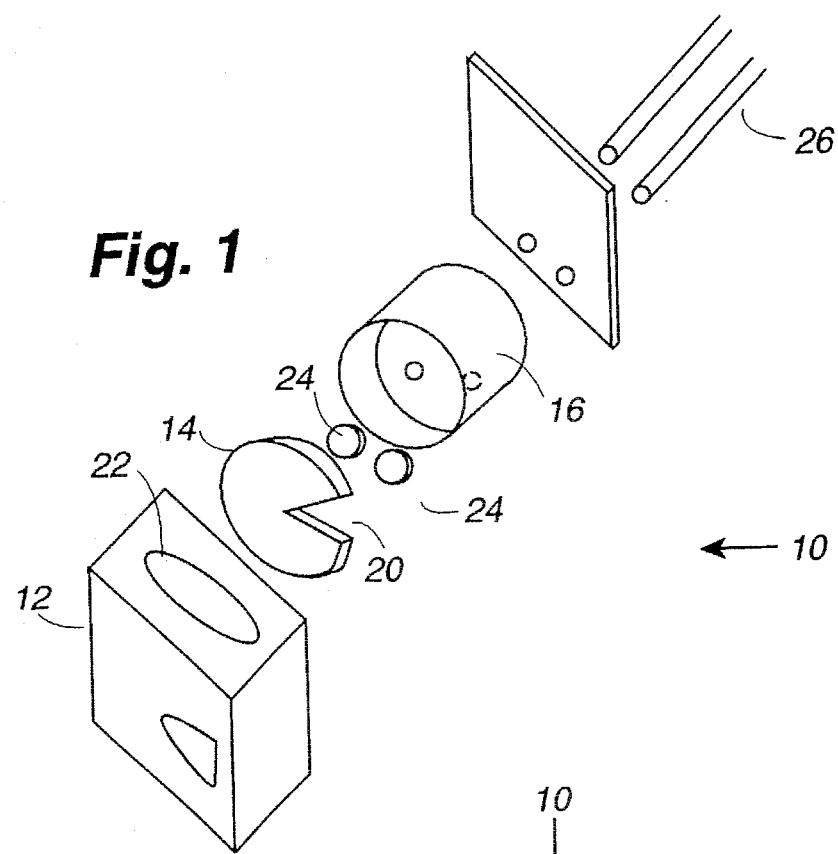
FIG. 1 is an exploded view of a substrate heater in accordance with the present invention.
Figure 2:
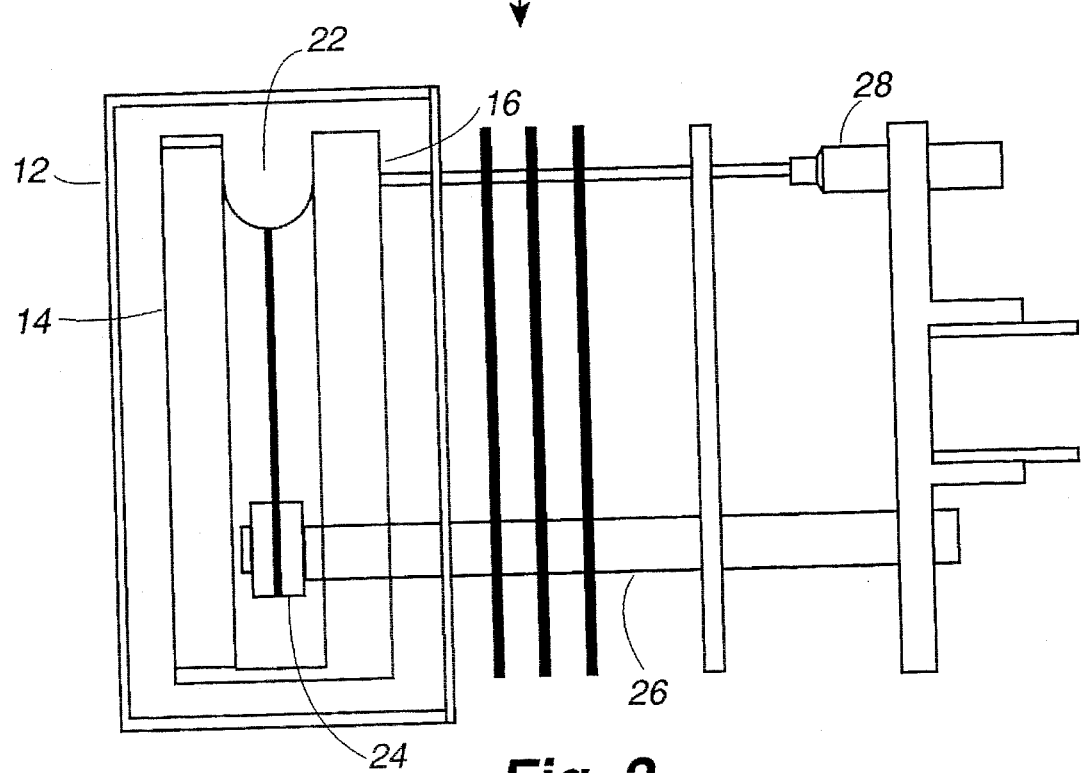
FIG. 2 is a side cross section of a substrate heater in accordance with the present invention.

Referring now to the figures, in FIG. 1 is shown an exploded view of a substrate heater 10 including a thermal heat shield 12, a first heating element 14 and a second heating element 16, said first and second heating elements defining a heating cavity 18. First heating element 14 further defines an opening 20 through which material to be deposited can be entered into heating cavity 18. Thermal heat shield 12 also includes an opening corresponding to opening 20 in first heating element 14. Although thermal heat shield 12 is shown in a rectangular-type configuration, it can be circular-type, i.e., cylindrical, in shape as well. Second heating element 16 further defines a slot opening 22 through which a target disk can be entered into heating cavity 18. Within heating cavity 18 is a support means 24 for supporting a target disk within the heating cavity. Support means 24 is attached to rotating means 26 for rotating the target disk upon support means 24 within heating cavity 18. The rotating means includes appropriate gears for rotating the support means upon which a target wafer rests. Rotation of the support means then spins the target wafer within the substrate heater to provide for complete and uniform film deposition. The substrate heater can further include a thermocouple 28 for measuring the temperature at, e.g., the surface of the heating elements for subsequent control of the heating elements. FIG. 2 shows a side cross section of a substrate heater with the same numbered elements as in FIG. 1.

The presently described heating apparatus is particularly designed for target substrates shaped as disks with the heating elements then being generally circular shaped. In cases where a substrate is of another configuration such as square or rectangular, the heating elements would then be configured to provide suitable distribution of heating to that shaped substrate.

The opening in the heating element which allows the desired coating material into the heating cavity can generally be of any shape, but is preferably in the shape of a wedge. Such a wedge shaped opening is generally situated with one point of the wedge at the center of the circular shaped heating element and has an angle between the two sides of the wedge from about 30° to about 60°. The geometry of the opening is related to the intended deposition thickness or uniformity, to the size and shape of, e.g., a vapor plume of coating material, and to any differential temperature across the surface of the target substrate.

Preferably, the arriving vapor plume would be scanned, i.e., moved back and forth across the wedge opening to achieve film thickness uniformity. Such scanning can be accomplished by moving a mirror that directs the laser beam into the deposition chamber. Commercial units are available and well known for performing such scanning. Alternatively, the plume could be of a large size sufficient to completely cover the wedge-shaped opening.

In another arrangement the opening for entry of the vapor plume could be situated in the same plane as the wafer such that the plume could contact both sides of the wafer simultaneously. Additionally, such an edge on arrangement may lead to a reduction of particulates in the deposit.

The support means for the target substrate can include a combination of spools, preferably a pair of spools. Each spool has a groove perpendicular to the axis of rotation of the spool and the grooves of the spools are aligned linearly for support of the target substrate within said grooves, whereby said supported target substrate is situated substantially equidistant from said heating elements.

An alternative support means can include a single shaft approaching the rear of the wafer, i.e., opposite the side of the wafer being coated, the shaft using a clamp to hold and spin the wafer. As such a clamp would generally lead to tooling marks on the wafer, the spool arrangement is generally preferred.

The thermal shielding means can include heat shields separating the heating means and heating cavity from the surrounding environment. Such heat shields can protect, e.g., the adjacent drive gears and drive shafts from the high temperatures within the heating cavity.

The present invention is more particularly described in the following example which is intended as illustrative only, since numerous modifications and variations will be apparent to those skilled in the art.

EXAMPLE 1

The heater was installed in a vacuum chamber with feedthroughs for electrical connections (two power leads and two thermocouple leads) and a driveshaft for substrate rotation. The heater unit was mounted on a ¾-inch diameter stainless steel tube via a flange and setscrews on the back of a gear cage. A commercial motor with a vacuum-sealed shaft was mounted on the other end of the tube and a ¼-inch diameter driveshaft positioned in the center of the tube connected the motor to a 42-tooth gear in the gear cage. This gear drove two 12-tooth gears that were mounted on ¼-inch diameter ceramic shafts extending into the heater cavity. The wafer or substrate rested on and was supported by these shafts being held upright by a pair of ceramic spools on each shaft. The motor was operated at about 30 revolutions per minute (rpm) and the shafts rotated at about 105 rpm. A two-inch diameter wafer was rotated at ⅛ the shaft speed or about 13 rpm. The ¾ inch tube passed through a 6-inch diameter vacuum flange mounted upon the deposition chamber. The tube was sealed by an O-ring and supported by a linear bearing. Electrical connections were made to a commercial vacuum feedthrough also mounted on the vacuum flange.

Initial heater tests were conducted to determine electrical power requirements. Each heater disk contained a 500 Watt (W) heating element for a total of 1 kilowatt (kW). Based upon radiative heat loss calculations, the maximum expected operating temperature of about 950° C. could be obtained at about 880 W. To reach a more typical operating temperature of about 800° C., the calculated power requirement was about 520 W. Bench testing involved comparing applied power to heater disk temperature, the latter temperature being measured by a thermocouple attached to the rear disk. At 500 W, the disk temperature was measured at 815° C. While slightly higher than expected, the discrepancy was attributed to a heat-shielding effect from the wafer or substrate which may reduce heat loss from the back disk through the wedge opening.

For measurement of substrate temperature and temperature uniformity, a nickel wafer was used as the substrate and its temperature measured with an optical pyrometer. As a point on the wafer rotates past the opening in the substrate heater, it loses heat and cools slightly. Rough calculations indicated that the temperature drop would be about 20° C. per second of exposure to the opening. At a rotation of about 13 rpm, the exposure time was about ½ second. Pyrometer measurements taken on the wafer where it had just rotated into the opening and where it was about to rotate out of the opening showed a temperature drop of from about 15° to 20° C. This was considered acceptable for the deposition process and could be reduced if desired by increasing the rotation speed. No radial temperature gradients were observed, indicating that there was a high degree of uniformity of film properties from the center to the edge of the wafer.

The arriving vapor plume was scanned, i.e., moved back and forth across the wedge opening to achieve film thickness uniformity. Such scanning was accomplished using an available commercial unit to move a mirror that directs the laser beam into the deposition chamber. By beam scanning, thickness uniformity in the resultant coating on the wafer was found to vary less than from about ±2 to ±5 percent over a 2-inch wafer. Additionally, as the support spools contact the wafer in a region where there is no deposition, i.e., inside the cavity, the wafer was found to be free of tooling marks and completely coated to the edge.

Measurements of superconducting transition temperature on wafers coated with the high temperature superconductor yttrium-barium-copper oxide at a disk temperature of 825° C. and an oxygen pressure of 0.15 torr ranged from about 91 K in the center of a 2-inch wafer to about 86 K at the edge. These numbers were the same for both sides of the wafer, which had been coated on one side, cooled, then flipped, reheated and coated on the other side.

Although the present invention has been described with reference to specific details, it is not intended that such details should be regarded as limitations upon the scope of the invention, except as and to the extent that they are included in the accompanying claims.

What is claimed is:

1. A substrate heater for thin film deposition of metallic oxides upon a target substrate configured as a disk comprising means for supporting in a location a target substrate configured as a disk;

means for rotating the target substrate upon the support means; and, means for heating the target substrate, the heating means including a pair of heating elements defining a heating cavity around the support means with one heater element situated on each side of the location for the target substrate, one heater element defining an opening through which a desired coating material can enter for thin film deposition and the heating means includes an opening slot through which the target substrate can be entered into the heating cavity onto the support means.

2. The substrate heater of claim 1 further including a means for thermal shielding of the heating means from surrounding environment.

3. The substrate heater of claim 1 wherein said opening through which a desired coating material can enter is configured as a wedge.

4. The substrate heater of claim 3 wherein said wedge is defined as an opening with an angle from about 30° to about 60°.

5. The substrate heater of claim 1 wherein said support means includes at least two spools, each spool having a groove and said grooves aligned linearly for support of the target substrate within said grooves, whereby said supported target substrate is situated substantially equidistant from said heating elements.

6. The substrate heater of claim 5 wherein said rotating means includes a gear drive for rotating said spools.

7. The substrate heater of claim 1 wherein said heating elements defining a heating cavity surrounds the support means.

* * * * *